United States Patent
Wang

[19]

[11] Patent Number: 5,910,914
[45] Date of Patent: Jun. 8, 1999

[54] SENSING CIRCUIT FOR A FLOATING GATE MEMORY DEVICE HAVING MULTIPLE LEVELS OF STORAGE IN A CELL

[75] Inventor: Ping Wang, Saratoga, Calif.

[73] Assignee: Silicon Storage Technology, Inc., Sunnyvale, Calif.

[21] Appl. No.: 08/965,834

[22] Filed: Nov. 7, 1997

[51] Int. Cl.[6] .................................................. G11C 16/06
[52] U.S. Cl. ................................ 365/185.21; 365/185.2; 365/185.03; 365/189.07; 327/51
[58] Field of Search .......................... 365/185.21, 185.03, 365/207, 185.2, 189.07; 327/51

[56] References Cited

U.S. PATENT DOCUMENTS

| | | |
|---|---|---|
| 4,223,394 | 9/1980 | Pathak et al. . |
| 5,262,984 | 11/1993 | Noguchi et al. ........................ 365/185 |
| 5,386,158 | 1/1995 | Wang . |
| 5,394,362 | 2/1995 | Banks ................................. 365/189.01 |
| 5,550,772 | 8/1996 | Gill ..................................... 365/185.03 |
| 5,642,312 | 6/1997 | Harari ................................. 365/185.33 |

*Primary Examiner*—David Nelms
*Assistant Examiner*—Tuan T. Nguyen
*Attorney, Agent, or Firm*—Ronald L. Yin; Limbach & Limbach LLP

[57] ABSTRACT

A sensing circuit for sensing the multiple states of a selected memory cell of a floating gate memory device is disclosed. The sensing circuit has a first voltage amplifier which generates a first output voltage, and a plurality of current amplifiers which receive the first output voltage and generate a plurality of first output currents in response thereto. The circuit also comprises a dummy cell, a second voltage amplifier connected thereto for generating a second output voltage. A second current amplifier receives the second output voltage and generates a plurality of second output currents in response thereto. Each of a plurality of inverters receives one of the first and one of the second output currents, and generates an output. The output of the plurality of invertors are supplied to a decoder to generate a decoded signal representative of the plurality of states of the selected memory cell.

7 Claims, 2 Drawing Sheets

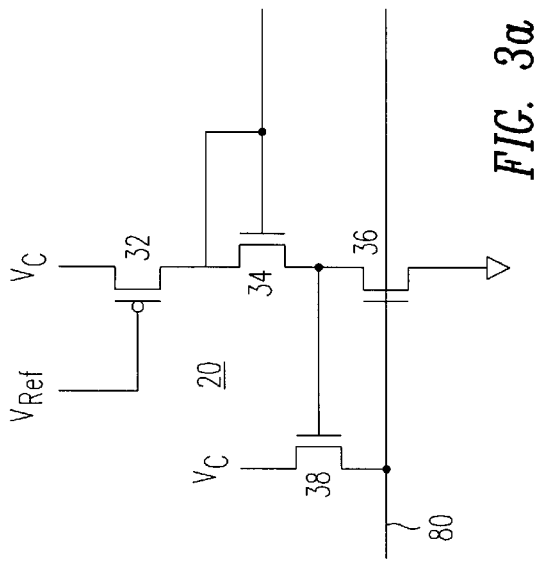
*FIG. 3a*
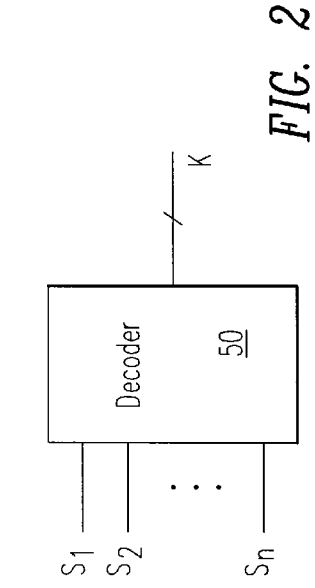
*FIG. 2*
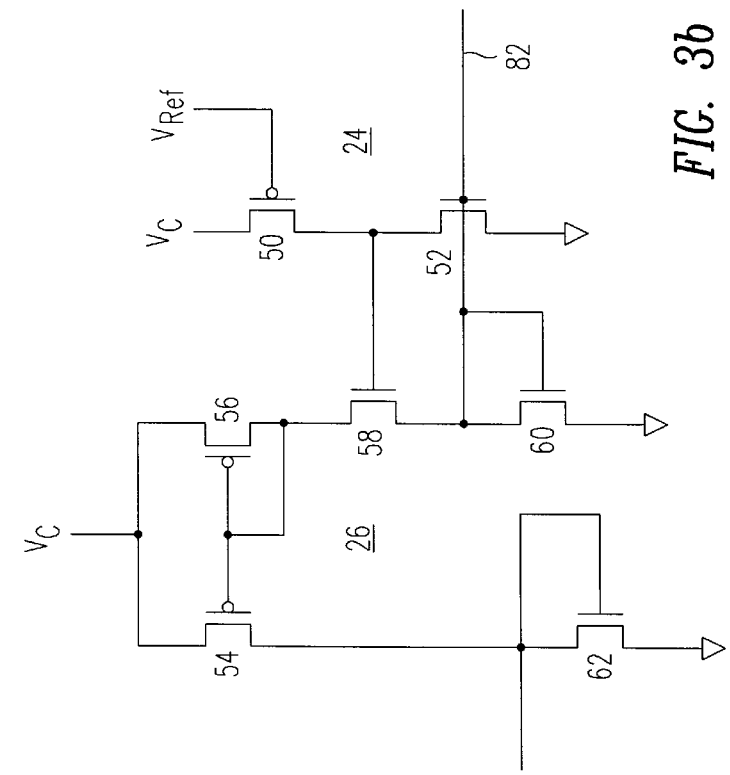
*FIG. 4*
*FIG. 3b*

SENSING CIRCUIT FOR A FLOATING GATE MEMORY DEVICE HAVING MULTIPLE LEVELS OF STORAGE IN A CELL

TECHNICAL FIELD

The present invention relates to a sensing circuit for use with a memory array comprised of floating gate devices, having a plurality of cells, with each cell storing multiple levels of storage. More particularly, the present invention relates to the use of a plurality of inverters to compare the current from a reference cell to the current from a selected cell to determine the state of storage of the selected cell.

BACKGROUND OF THE INVENTION

Sense amplifiers used with memory devices, such as floating gate memory devices, are well known in the art. See, for example, U.S. Pat. No. 4,223,394. However, in that reference, two transistors with differing thresholds are used to set the sensing level voltage. See, for example, column 4, lines 16–17 thereof. The drawbacks of this technique is that the threshold difference may vary with process and thus there is no assurance that the difference in the thresholds will be maintained. In addition, if the threshold difference is too great, speed in sensing suffers.

Sense amplifiers using an inverter to compare the current of a reference cell to the current from a selected cell is also well known. See for example U.S. Pat. No. 5,386,158. However, that reference discloses only the sensing of a selected cell having a single level of storage, i.e. one bit of storage.

In an article entitled "Novel Small-area Readout Circuit for Multi-Level Memories" by D. Montanari et. al. published in the 15th Annual IEEE Non-Volatile Semiconductor Memory Workshop, Monterey, Calif. (Feb. 9–12, 1977), the authors disclosed a multi-level sense amplifier using a plurality of comparators, and concluded that the use of a plurality of comparators in multi-level sense amplifier was not desirable due to the considerable area cost of the comparators.

SUMMARY OF THE INVENTION

In accordance with the present invention, a sensing circuit for sensing a plurality of states of a select floating gate memory cell of a memory device is disclosed. There are three embodiments of the present invention. In the first embodiment, the sensing circuit comprises a first line coupled to said memory device. A first voltage amplifier means is coupled to the first line and generates a first output voltage. A plurality of first current amplifier transistors receives the first output voltage and generates a plurality of different first output currents in response thereto. Each of the plurality of first current amplifier transistors comprises a transistor having a size different from one another, and having a gate for receiving the first output voltage, a first terminal which is connected to a voltage source, and a second terminal for generating one of the plurality of different first output currents. The sensing circuit also has a means for generating a reference current, and a plurality of inverter means. Each inverter means has a single input and a single output and receives one of the plurality of different first output currents and the reference current at its single input, and generates an output signal in response thereto. A decoder means receives the plurality of output signals and generates a decoded signal representative of the plurality of states stored in said select floating gate memory cell. In a second embodiment, the plurality of first current amplifier transistors generates the same first output current. A reference voltage generator generates a reference voltage. The reference voltage is supplied to a plurality of second current amplifier transistors each of which has a different size from one another, and generates a plurality of different second output currents in response thereto. Finally, in the third embodiment, the plurality of first current amplifier transistors generates the same first output current. A reference voltage generator generates a plurality of different reference voltages. The plurality of different reference voltages are supplied to a plurality of second current amplifier transistors each of which has the same size, generating a plurality of different second output currents in response thereto.

BRIEF DESCRIPTION OF THE DRAWINGS

FIG. 2 is a block diagram of a decoder for receiving the plurality of output signals from the sensing circuit shown in FIG. 1, and for generating a decoded signal in response thereto.

FIG. 3a and 3b are detailed circuit diagrams of portions of the sensing circuit shown in FIG. 1.

FIG. 4 is a schematic diagram of a circuit for generating the reference voltage used in the circuit shown in FIGS. 3a and 3b.

DETAILED DESCRIPTION OF THE DRAWINGS

Figure 1:
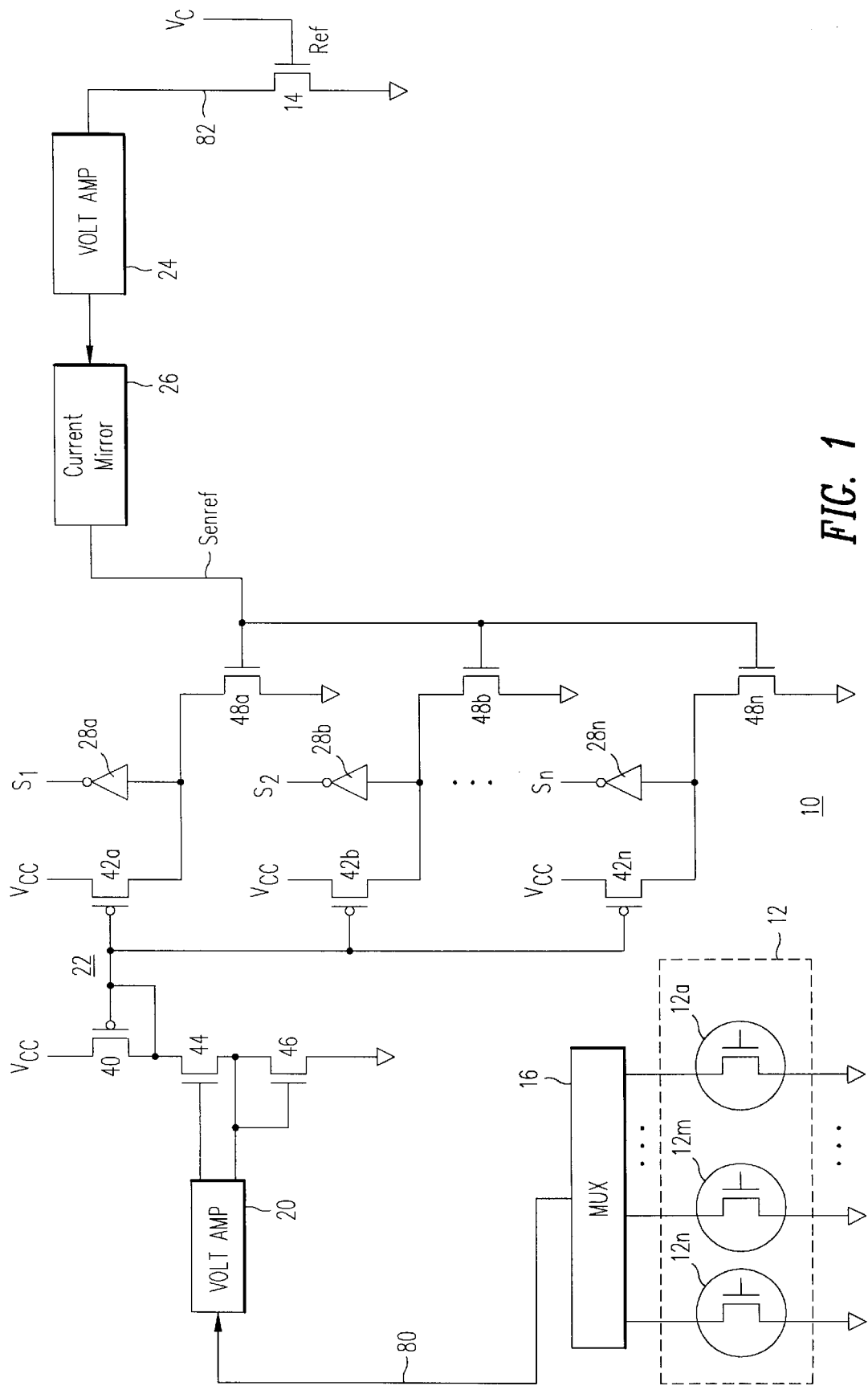
FIG. 1 is a schematic diagram of the sensing circuit of the present invention used with a memory array comprising of a plurality of floating gate devices.

Referring to FIG. 1 there is shown in block diagram form the sensing circuit 10 of the present invention. The sensing circuit 10 is adapted to be used with a memory array 12 comprising of a plurality of floating gate memory devices such as, 12a, ... 12n. The plurality of memory devices 12(a ... n) are arranged in a plurality of rows and columns, as is well known in the art. Each of the memory devices 12(a ... n) comprises a memory cell which can store a plurality of binary states. The plurality of columns of memory devices are all supplied to a multiplexer 16. When it is desired to sense the state of a particular floating gate memory device in a particular column, that column is connected through the multiplexer 16 to a first line 80, and is supplied to a first voltage amplifier 20.

The first voltage amplifier 20 outputs a first output voltage which is supplied to a first current mirror 22. The first current mirror 22 comprises P-type MOS transistors 40 and 42a, and N-type MOS transistors 44 and 46. The gate of the MOS transistor 44 is connected to the gate of the MOS transistor 34 (shown in FIG. 3a). The drain of the transistor 44 is connected to the drain of the P-type MOS transistor 40, which is also connected to its gate. The source of the P-type MOS transistor 40 is connected to a source of positive voltage potential $V_{CC}$. The source of the transistor 44 is connected to the source of an N type transistor 46, whose drain is connected to ground. The gate of the N type transistor 46 is connected to its source, and to the gate of the transistor 36 (shown in FIG. 3a).

The gate of the P-type MOS transistor 40 generates an output voltage which depends upon the state of the select memory cell being sensed. The gate of the P-type MOS transistor 40 is connected to the gate of a plurality of P-type MOS transistors 42(a ... n). The number of P-type MOS transistors 42(a ... n) being used depends upon the number of states that each memory cell 12(a ... n) can store and to which the sensing circuit 10 is directed to detect. In general, if each of the memory cell 12($a \ldots n$) can store M states, then only M-1 transistors 42 are needed. The source of each of the plurality of P-type MOS transistors 42($a \ldots n$) is connected to a source of positive voltage potential $V_C$. The drain of each of the plurality of P-type MOS transistor 42($a \ldots n$) generates an output current which is proportional to the voltage supplied to the gate of the P-type MOS transistor 42($a \ldots n$). The output current of each P-type MOS transistor 42($a \ldots n$) is supplied to an invertor 28($a \ldots n$). Each of the inverters 28 has a single input and an output. The output current from the associated transistor 42 is supplied to the input of the associated inverter 28.

The different states of a select floating gate memory device 12($a$–$n$) are compared to a so-called "dummy" floating gate memory device 14. The dummy memory device 14 is connected to a second voltage amplifier 24. The second voltage amplifier 24 generates a second output voltage in response thereto. The second output voltage is supplied to a second current mirror 26. The second current mirror 26 generates a second current which is also mirrored by a plurality of N-type MOS transistors 48($a \ldots n$) each of which has a drain which is connected to an inverter 28($a \ldots n$) and a source which is connected to ground potential. The voltage at the gate of each of the transistors 48($a \ldots n$) is a reference voltage denoted as Senref. Each of the inverters 28($a \ldots n$), e.g. invertor 28($x$), compares the first current from a corresponding transistor 42($x$), and the second current from a corresponding transistor 48($x$), and generates a signal S($l \ldots n$) in response thereto. The signal S($l \ldots n$) is either low or high depending upon whether the current from the transistor 42($x$) is greater than or less than the current from the transistor 48($x$).

Referring to FIG. 3$a$ there is shown in greater detail the voltage amplifier 20. The MOS transistor 38 is connected to the first sensing line 80. The MOS transistor 38 has a source, a gate and a drain. As used hereinafter and as is well known in the art, the term "source" and the term "drain" can be used interchangeably. The source is connected to the first sensing line 80. The drain is connected to a source of positive voltage potential such as Vc. The gate is connected to the first voltage amplifier 20. The first sensing line 80 is also connected to the first voltage amplifier 20.

The first voltage amplifier 20 comprises a P-type MOS transistor 32 and two N-type MOS transistors 34 and 36, respectively. The gate of the MOS transistor 36 is connected to the first sensing line 80. The source of the MOS transistor 36 is connected to a ground potential. The drain of the MOS transistor 36 is connected to the gate of the MOS transistor 38 and to the source of the MOS transistor 34. The drain and gate of the MOS transistor 34 are connected together and to the drain of the P-type MOS transistor 32. The gate of the transistor 32 is connected to a source of positive reference voltage, $V_{REF}$. The source of the P-type MOS transistor 32 is connected to the positive voltage source $V_C$.

From the first voltage amplifier 20, the gate of the N-type MOS transistor 44 is connected to the gate of the MOS transistor 34. The drain of the transistor 44 is connected to the drain of the P-type MOS transistor 40, which is also connected to its gate. The source of the P-type MOS transistor 40 is connected to a source of positive voltage potential $V_C$. The gate of the P-type MOS transistor 40 is connected to the gate of each of the plurality of the P-type MOS transistors 42($a \ldots n$). The source of each of the P-type MOS transistors 42 is connected to a source of positive voltage potential $V_C$. Thus, in this manner, the P-type MOS transistor 40 and each of the transistors 42 operate as a current mirror.

The first sensing line 80 is also connected to an N-type MOS transistor 46. The drain and the gate of the MOS transistor 46 are connected together and to the first sensing line 80 as well as to the source of the MOS transistor 44. The source of the MOS transistor 46 is connected to ground potential. Transistor 46 functions as a diode connected weak transistor. The drain of each of the P-type MOS transistors 42($a \ldots n$) is supplied to the single input of a corresponding inverter 28($a \ldots n$).

The sensing circuit 10 also comprises a so-called "dummy" cell 14. The dummy cell 14 is a floating gate memory cell which is always in the conductive state. It has a source, gate and a drain with the source connected to a ground potential and the gate connected to a source of a positive voltage potential such as $V_C$. The drain is connected to a second sensing line 82.

The second sensing line 82 is supplied to a second voltage amplifier 24. The second voltage amplifier 24 comprises a P-type MOS transistor 50 and an N-type MOS transistor 52. The N-type MOS transistor 52 has its gate connected to the second sensing line 82. The source of the MOS transistor 52 is connected to ground potential. The drain of the MOS transistor 52 is connected to the drain of the P-type MOS transistor 50. The gate of the P-type MOS transistor 50 is connected to the same source of positive reference voltage, $V_{REF}$, as the gate of the transistor 32 is connected. The source of the P-type MOS transistor 50 is connected to a source of positive voltage potential $V_C$.

From the second voltage amplifier 24, the signal from the dummy cell 14 along the second sensing line 82 is then supplied to the second current mirror 26. The second current mirror 26 is identical to the first current mirror 22. It also comprises two P-type MOS transistors 54 and 56 and a N-type MOS transistor 58. The P-type MOS transistors 54 and 56 are connected in a current mirror configuration. In addition, the signal from the second sensing line 82 is supplied to an N-type MOS transistor 60. The N-type MOS transistor 60 is identical to the N-type MOS transistor 46 and like the N-type MOS transistor 46 serves to function as a diode connected weak transistor.

From the second current amplifier 26, the signal is supplied from the drain of the P-type MOS transistor 54. The drain of the P-type MOS transistor 54 is connected to an N-type MOS transistor 62 at its drain. In addition, the drain and the gate of the N-type MOS transistor 62 are connected together. The source of the N-type MOS transistor 62 is connected to a ground potential. The output of the second current mirror 26 at the drain of the P-type MOS transistor 54 is a constant current source. This constant current source is supplied to the gate of a plurality of N-type MOS transistors 48($a \ldots n$) whose drain is connected to the single input of its respective invertor 28($a \ldots n$) and whose source is connected to ground potential. The voltage at the gate of each of the transistors 48($a \ldots n$) is a reference voltage denoted as Senref.

There are three possible embodiments for the sensing circuit 10.

First Embodiment

In the first embodiment, each of the plurality of transistors 42($a \ldots n$) has a different size. Furthermore, each of the transistors 48($a \ldots n$) is of the same size and is supplied with a constant Senref voltage. Thus each of the transistors 48($a \ldots n$) pulls the same amount of current from its source through its drain to ground potential.

In the operation of the first embodiment of the sensing circuit 10, if the floating memory cell 12 is in a nonconductive state, then no current would flow along the first sensing line 80. If we assume that the voltage on the first sensing line 80 is initially zero, then both transistors 38 and 44 will initially be on to bring up the voltage on the first sensing line 80. When the voltage on the first sensing line 80 goes up, the voltage at both the gate of transistor 34 and the gate at transistor 38 will go down. Transistor 38 will be turned off when the voltage at its gate is no longer one threshold greater than the voltage on the first sensing line 80. At that point, since the voltage at the gate of transistor 34 is one threshold greater than the voltage at the gate of transistor 38, transistor 44 would still be on. Therefore, transistor 40 would continue to supply current to charge up the first sensing line 80 through transistor 44. Voltage on the first sensing line 80 will reach a saturation level when the current through the transistor 44 approaches the current through transistor 46 where transistor 46 is acting as a diode connected weak transistor, which prevents voltage on the first sensing line 80 from going too high and cutting off transistor 44. At the saturation point, the voltage on the first sensing line 80 would be at a high clamp level, designated as VH.

If we assume that the floating gate memory cell 12 is in a certain conductive state, a first current will flow along the first sensing line 80. If we assume that the current flowing on the first sensing 80 due to the conduction of the floating memory cell 12 is stronger than the amount of current that transistor 44 can supply, then the voltage at the gate of the transistor 38 will rise. When the voltage at the gate of transistor 38 is one threshold greater than the voltage on the first sensing line 80, then transistor 38 will conduct and clamp or hold the voltage on the first sensing line 80 at that level. At that time, the voltage at the gate of transistor 34 would be one threshold greater than the voltage at the gate of transistor 38 while the voltage at the sensing line 80 is maintained at the low clamp level, designated as VL. Current flow will be from transistor 40 through transistor 44 onto the first sensing line 80 to maintain the conductive state of the cell 12.

The current through the transistor 40 is mirrored by the current flowing through transistor 42. However, because each of the transistors 42(*a* . . . *n*) is of a different size, the amount of current passing through each of the transistors 42(*a* . . . *n*) would differ. Thus, the current flow into each of the inverters 28(*a* . . . *n*) from transistors 42(*a* . . . *n*) would differ. As can be seen from FIG. 1, the single input to each inverter 28(*a* . . . *n*) is connected to both the drain of the corresponding P-type MOS transistor 42(*a* . . . *n*) and to the drain of the corresponding N-type MOS transistor 48(*a* . . . *n*). Depending upon the net current flow into or out from the single input to the inverter 28(*x*), the output of the inverter 28(*x*), S(*l* . . . *n*), will either be high or low. If the current flow through transistor 42(*x*) is greater than the current flow through transistor 48(*x*), which has a reference current flow therethrough, then the voltage at the input to the invertor 28(*x*) will rise and S(*l* . . . *n*) will go low. If the current through transistor 42(*x*) is less than the current through transistor 48 (*x*), then the voltage at the input to the inverter 28(*x*) will fall and S(*l* . . . *n*) will be high.

Thus, there are two current sources to the single input of each inverter 28(*x*). The current is supplied from the corresponding transistor 42(*x*) and corresponding transistor 48(*x*). Each of the transistors has a gate having a voltage applied thereto. In the case of transistor 48(*x*), it is a constant reference voltage called senref. In the case of transistor 42(*x*), it is a voltage level that is determined by the voltage at the gate of transistor 34, and ultimately by the amount of conduction of the state of the memory cell 12.

Depending upon the voltage level applied to the gate of MOS transistors 42(*x*) and 48(*x*), the MOS transistor would turn on by degrees, i.e. the transistor does not "turn on" in a step function-like manner. Therefore, depending whether or not transistor 42(*x*) is turned on harder or softer than transistor 48(*x*), more or less current would flow from transistor 42(*x*) then through transistor 48(*x*).

In that event, the net current is either into the inverter 28(*x*) or out from the inverter 28(*x*). As a result, the inverter 28(*x*) would detect the current flow, i.e. into or out from, and the output of the inverter 28(*x*) S(*l* . . . *n*) would either be a High or a Low respectively, indicating the state of the memory cell 12.

If we assume that a select floating gate memory cell has four possible states, then three inverters 28(*a* . . . *c*) along with their respective associated transistors 42(*a* . . . *c*) and 48(*a* . . . *c*) are provided. If a select floating gate memory cell is in a non-conductive state, then of course, no current would pass through any of the transistors 42(*a* . . . *c*). In that event the output of all three inverters 28(*a* . . . *c*) would be High. If a select floating gate memory cell is in a first conductive state, then the amount of current flowing therethrough is amplified, with the current through transistor 42(*a*) being the lowest amount and the current through transistor 42(*c*) being the largest amount. The size of the transistors 42(*a* . . . *c*) are chosen such that in the first conductive state, the current through transistor 42(*a*) would still be less than the current through the associated transistor 48(*a*), thereby causing corresponding inverter 28(*a*) to output High. The size of the transistors 42(*a* . . . *c*) is chosen such that transistors 42(*b,c*) would conduct more current than the current through the corresponding transistor 48(*b,c*), thereby causing the corresponding inverter 28(*b,c*) to output Low. Thus, the four possible outputs of the inverters 28(*a* . . . *c*) are as follows:

| State: | 28(a) | 28(b) | 28(c) |
|---|---|---|---|
| 0 | H | H | H |
| 1 | L | H | H |
| 2 | L | L | H |
| 3 | L | L | L |

The outputs of all the invertors 28(*a* . . . *c*) are supplied to a decoding circuit 50 to generate a decoded signal, representing the state of storage or conduction of the selected floating gate memory cell.

Second Embodiment

In the second embodiment, each of the plurality of transistors 42(*a* . . . *n*) has the same size, but each of the transistors 48(*a* . . . *n*) is of a different size and is supplied with a constant Senref voltage. Thus each of the transistors 48(*a* . . . *n*) pulls a different amount of current from its source through its drain to ground potential.

In the operation of the second embodiment of the sensing circuit 10, if the floating memory cell 12 is in a nonconductive state, then no current would flow along the first sensing line 80. This would in turn cause no current to flow through any of the transistors 42(*a* . . . *c*). Thus all of the inverters 28(*a* . . . *c*) would output High.

If we assume that the floating gate memory cell 12 is in a certain conductive state, a first current will flow along the first sensing line 80. This current is reflected in the current flowing through each of the transistors 42 (*a* . . . *n*). However, because all of the transistors 42(*a* . . . *c*) are of the same size, the amount of current passing through each of the transistors 42(a ... n) are the same. The amount to all of the transistors 42(a ... c) would differ only due to the state of conduction of the select floating gate memory cell 12.

On the other hand, since the gate of each of the transistors 48(a ... c) is supplied with the same reference voltage Senref, but each of the transistors 48(a ... c) differs in size, the amount of current passing through each of the transistors 48(a ... c) would differ. Thus, the amount of current from a select transistor 42(a) is compared by the corresponding inverter 28(a) to the amount of current form the corresponding transister 48(a). The current flow into each of the inverters 28(a ... n) from transistors 42(a ... n) would differ. Depending upon the net current flow into or out from the single input to the inverter 28(x), the output of the inverter 28(x), S(l ... n) will either be high or low. If the current flow through transistor 42(x) is greater than the current flow through transistor 48(x), which has a reference current flow therethrough, then the voltage at the input to the inverter 28(x) will rise and S(l ... n) will go low. If the current through transistor 42(x) is less than the current through transistor 48(x), then the voltage at the input to the inverter 28(x) will fall and S(l ... n) will be high.

Thus, there are two current sources to the single input of each inverter 28(x). The current is supplied from the corresponding transistor 42(x) and corresponding transistor 48(x). Each of the transistors has a gate having a voltage applied thereto. In the case of transistor 48(x), it is a constant reference voltage called Senref, but since each transistor 48(x) is of a different size, the amount of current supplied to each corresponding inverter 28(a ... n) would differ. In the case of transistor 42(x), it is a voltage level that is determined by the voltage at the gate of transistor 34, and ultimately by the amount of conduction of the state of the memory cell 12.

Depending upon the voltage level applied to the gate of MOS transistors 42(x) and 48(x), the MOS transistor would turn on by degrees, i.e. the transistor does not "turn on" in a step function-like manner. Therefore, depending whether or not transistor 42(x) is turned on harder or softer than transistor 48(x), more or less current would flow from transistor 42(x) then through transistor 48(x).

In that event, the net current is either into the inverter 28(x) or out from the inverter 28(x). As a result, the inverter 28(x) would detect the current flow, i.e. into or out from, and the output of the inverter 28(x) S(l ... n) would either be a High or a Low respectively, indicating the state of the memory cell 12.

If we assume that a select floating gate memory cell has four possible states, then three inverters 28(a ... c) along with their respective associated transistors 42(a ... c) and 48(a ... c) are provided. If a select floating gate memory cell is in a non-conductive state, then of course, no current would pass through any of the transistors 42(a ... c). In that event the output of all three inverters 28(a ... c) would be High. If a select floating gate memory cell is in a first conductive state, then the amount of current flowing therethrough is amplified, with the current through transistor 42(a) being the same amount as the current through transistor 42(c). The size of the transistors 48(a ... c) is chosen such that transistors 48(b,c) would conduct more current than the current through the corresponding transistor 42(b,c), when the select floating gate memory transistor is in the first state, thereby causing the corresponding invertor 28(b,c) to output Low. Thus, the four possible outputs of the invertors 28(a ... c) are as follows:

| State: | 28(a) | 28(b) | 28(c) |
|---|---|---|---|
| 0 | H | H | H |
| 1 | L | H | H |
| 2 | L | L | H |
| 3 | L | L | L |

The outputs of all the inverters 28(a ... c) are supplied to a decoding circuit 50 to generate a decoded signal, representing the state of storage or conduction of the selected floating gate memory cell.

Third Embodiment

In the third embodiment, each of the plurality of transistors 42(a ... n) has the same size, and each of the transistors 48(a ... n) is also of the same size. However each of the transistors 48(a ... n) is supplied with a different Senref voltage. Thus each of the transistors 48(a ... n) pulls a different amount of current from its source through its drain to ground potential. This can be accomplished by, for example, placing a different reference voltage on the gate of the P-type MOS transistor 50.

The operation of this third embodiment would then be identical to the operation of the second embodiment except that a plurality of voltage amplifier circuits 24 and current mirrors 26 must be provided.

General Consideration

Transistors 32 and 36 form an amplifier whose gain is determined by the biasing reference voltage, $V_{REF}$. If we assume the gain of the transistor 32–36 amplifier is Av, then at any time the voltage at the gate of transistor 38 is $$V(G_{38})=V(G_{34})-V_T \qquad (1)$$

at VL or low level clamp $$VL(G_{38})=VL(\text{line } 80)+V_T \qquad (2)$$

at VH or high level clamp $$VH(G_{34})=VH(\text{line } 80)+V_T \qquad (3)$$

Therefore, substituting (1) into (3), $$VH(G_{38})=VH(\text{line } 80) \qquad (4)$$

(4)–(2) results in $$VH(G_{38})-VL(G_{38})=VH(\text{line } 80)-VL(\text{line } 80)-V_T \qquad (5)$$

Since the amplifier has a gain of Av, $$VH(G_{38})-VL(G_{38})=Av^*(VH(\text{line } 80)-VL(\text{line } 80)) \qquad (6)$$

Substituting (6) into (5) gives, $$VH(\text{line } 80)-VL(\text{line } 80)=-VT/(Av-1) \qquad (7)$$

If AV=–5, $V_T$=0.6, the total voltage swing is $$VH(\text{line } 80)-VL(\text{line } 80)=0.1v$$

The generation of reference voltage, Senref, is accomplished as follows. The dummy cell 14 is a floating gate memory cell whose select gate and floating gate are connected to $V_C$. Thus, the voltage on the second sensing line 82 is very close to the voltage on the first sensing line 80. The current flow through the dummy cell 14 is controlled by the second voltage amplifier 24. The second voltage amplifier comprises transistors 50 and 52, and form an amplifier with the same gain as the amplifier formed by transistors 32 and 36. The current flowing through the second sensing line 82 is mirrored by the transistors 54, 56 and 58 of the second current mirror 26. The voltage, Senref, developed at the gate of transistor 48 is used to bias the transistor 48 to generate a reference current for sensing.

In summary, when the floating gate memory cell 12 is in a non-conductive state, transistor 44 is turned on. When the floating gate memory cell 12 is in a conductive state, transistors 38 and 44 are both turned on. Thus, irrespective of the state of conduction of the floating gate memory cell 12, transistor 44 will always be on. To turn transistor 44 on, transistor 34 generates an output voltage in response to the state of the floating gate memory cell 12 being in one state and generates a second output voltage in response to the binary state of the floating gate memory cell 12 in another state. Thus, transistor 34 is also always conductive irrespective of the state of the floating gate memory cell 12. The voltage at the gate of transistor 58, derived by the current flowing through the second sensing line 82, will always be a voltage between the first output voltage and the second output voltage generated at the gate of the transistor 34.

As can be seen from the foregoing, a multi-state sensing circuit 10 can detect the state of the storage of a selected floating gate memory cell.

What is claimed is:

1. A sensing circuit for sensing the state of a select floating gate memory cell, having a plurality of states stored therein, from a memory device, comprising:

a first line coupled to said memory device;

a first voltage amplifier means coupled to said first line and for generating a first output voltage;

a plurality of first current amplifier transistors for receiving said first output voltage and for generating a plurality of different first output currents in response thereto; each of said plurality of first current amplifier transistors comprises a transistor having a size different from one another, and having a gate for receiving said first output voltage, a first terminal supplied to a first voltage source, and a second terminal for generating one of said plurality of different first output currents;

means for generating a reference current;

a plurality of inverter means, each having a single input and a single output and for receiving one of said plurality of different first output currents and said reference current at its single input, and for generating an output signal in response thereto; said plurality of inventer means for generating a plurality of output signals; and decoder means for receiving said plurality of output signals and for generating a decoded signal representative of said plurality of states stored in said select floating gate memory cell.

2. A sensing circuit for sensing the state of a select floating gate memory cell, having a plurality of states stored therein, from a memory device, comprising:

a first line coupled to said memory device;

a first voltage amplifier means coupled to said first line and for generating a first output voltage;

a plurality of first current amplifier transistors for receiving said first output voltage and for generating a plurality of same first output currents in response thereto; each of said plurality of first current amplifier transistors comprises a transistor having the same size, and having a gate for receiving said first output voltage, a first terminal supplied to a first voltage source, and a second terminal for generating one of said plurality of same first output currents;

means for generating a reference voltage;

a plurality of second current amplifier transistors for receiving said reference voltage and for generating a plurality of different reference currents in response thereto; each of said plurality of second current amplifier transistors comprises a transistor having a size different from one another, and having a gate for receiving said reference voltage, a first terminal supplied to a second voltage source, and a second terminal for generating one of said plurality of different reference currents;

a plurality of inverter means, each having a single input and a single output and for receiving one of said plurality of same first output currents and one of said plurality of different reference currents at its single input, and for generating an output signal in response thereto; said plurality of inverter means for generating a plurality of output signals; and decoder means for receiving said plurality of output signals and for generating a decoded signal representative of said plurality of states stored in said select floating gate memory cell.

3. A sensing circuit for sensing the state of a select floating gate memory cell, having a plurality of states stored therein, from a memory device, comprising:

a first line coupled to said memory device;

a first voltage amplifier means coupled to said first line and for generating a first output voltage;

a plurality of first current amplifier transistors for receiving said first output voltage and for generating a plurality of same first output currents in response thereto; each of said plurality of first current amplifier transistors comprises a transistor having the same size, and having a gate for receiving said first output voltage, a first terminal supplied to a first voltage source, and a second terminal for generating one of said plurality of same first output currents;

means for generating a plurality of different reference voltages;

a plurality of second current amplifier transistors, each for receiving one of said plurality of different reference voltages and for generating a plurality of different reference currents in response thereto; each of said plurality of second current amplifier transistors comprises a transistor having the same size, and having a gate for receiving one of said plurality of different reference voltages, a first terminal supplied to a second voltage source, and a second terminal for generating one of said plurality of different reference currents;

a plurality of inverter means, each having a single input and a single output and for receiving one of said plurality of same first output currents and one of said plurality of different reference currents at its single input, and for generating an output signal in response thereto; said plurality of inverter means for generating a plurality of output signals; and decoder means for receiving said plurality of output signals and for generating a decoded signal representative of said plurality of states stored in said select floating gate memory cell.

4. The sensing circuit of claims 2 or 3, wherein said first voltage amplifier means further comprises:

a first transistor having a source, a drain, and a gate; said source connected to said first voltage source, and said gate connected to a third voltage source;

a control transistor having a source, a gate, and a drain, with the drain connected to the gate, and to the drain of the first transistor, and providing said first output voltage; and a second transistor having a source, a drain and a gate, said drain connected to said source of said control transistor, said gate connected to said first line, and said source connected to said second voltage source.

5. The circuit for claim 4 wherein said first and second current amplifier means are substantially identical.

6. The circuit of claim 5 wherein said first voltage source is a positive potential source.

7. The circuit of claim 5 wherein said second voltage source is ground potential.

* * * * *